(12) United States Patent
Akiyama et al.

(10) Patent No.: US 8,138,064 B2
(45) Date of Patent: Mar. 20, 2012

(54) METHOD FOR PRODUCING SILICON FILM-TRANSFERRED INSULATOR WAFER

(75) Inventors: Shoji Akiyama, Gunma (JP); Yoshihiro Kubota, Gunma (JP); Atsuo Ito, Gunma (JP); Makoto Kawai, Gunma (JP); Kouichi Tanaka, Gunma (JP); Yuji Tobisaka, Gunma (JP); Yoshihiro Nojima, Gunma (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 12/922,569

(22) PCT Filed: Oct. 29, 2009

(86) PCT No.: PCT/JP2009/068593
§ 371 (c)(1),
(2), (4) Date: Sep. 14, 2010

(87) PCT Pub. No.: WO2010/050556
PCT Pub. Date: May 6, 2010

(65) Prior Publication Data
US 2011/0014775 A1 Jan. 20, 2011

(30) Foreign Application Priority Data
Oct. 31, 2008 (JP) ................................. 2008-281105
Oct. 27, 2009 (JP) ................................. 2009-246252

(51) Int. Cl.
*H01L 21/304* (2006.01)
(52) U.S. Cl. ........ 438/458; 438/149; 438/311; 438/475; 438/509; 438/752; 257/E21.32; 257/E21.082; 257/E21.121; 257/E21.237; 257/E21.248
(58) Field of Classification Search .................... 438/30, 438/97, 149, 197, 311, 458, 474, 475, 505, 438/509, 513, 752; 257/E21.32, E21.082, 257/E21.121, E21.237, E21.248, E21.304, 257/E21.311, E21.319, E21.568
See application file for complete search history.

(56) References Cited

U.S. PATENT DOCUMENTS
6,335,258 B1 1/2002 Aspar et al.
(Continued)

FOREIGN PATENT DOCUMENTS
EP 1970942 A1 9/2008
(Continued)

OTHER PUBLICATIONS
Abe et al., Jpn. J. Appl. Phys., 33; 514-518 (1994).
(Continued)

*Primary Examiner* — Hsien Ming Lee
*Assistant Examiner* — Walter H Swanson
(74) *Attorney, Agent, or Firm* — Lerner, David, Littenberg, Krumholz & Mentlik, LLP

(57) ABSTRACT

A method for producing a silicon film-transferred insulator wafer is disclosed. The method includes a surface activation step of performing a surface activation treatment on at least one of a surface of an insulator wafer and a hydrogen ion-implanted surface of a single crystal silicon wafer into which a hydrogen ion has been implanted to form a hydrogen ion-implanted layer; a bonding step that bonds the hydrogen ion-implanted surface to the surface of the insulator wafer to obtain bonded wafers; a first heating step that heats the bonded wafers; a grinding and/or etching step of grinding and/or etching a surface of a single crystal silicon wafer side of the bonded wafers; a second heating step that heats the bonded wafers; and a detachment step to detach the hydrogen ion-implanted layer by applying a mechanical impact to the hydrogen ion-implanted layer of the bonded wafers thus heated at the second temperature.

16 Claims, 1 Drawing Sheet

U.S. PATENT DOCUMENTS

| | | | |
|---|---|---|---|
| 6,352,909 B1 * | 3/2002 | Usenko | 438/458 |
| 2001/0019877 A1 * | 9/2001 | Miyake et al. | 438/481 |

FOREIGN PATENT DOCUMENTS

| JP | 11145438 A | 5/1999 |
| JP | 2001503568 T | 3/2001 |
| JP | 2004310051 A | 11/2004 |
| JP | 2007173354 A | 7/2007 |
| JP | 2008-124206 * | 5/2008 |
| JP | 2008263010 A | 10/2008 |

OTHER PUBLICATIONS

Bruel et al., Jpn. J. Appl. Phys., 36; 1636-1641 (1997).

International Search Report, PCT/JP2009/068593, dated Jan. 26, 2010.

* cited by examiner

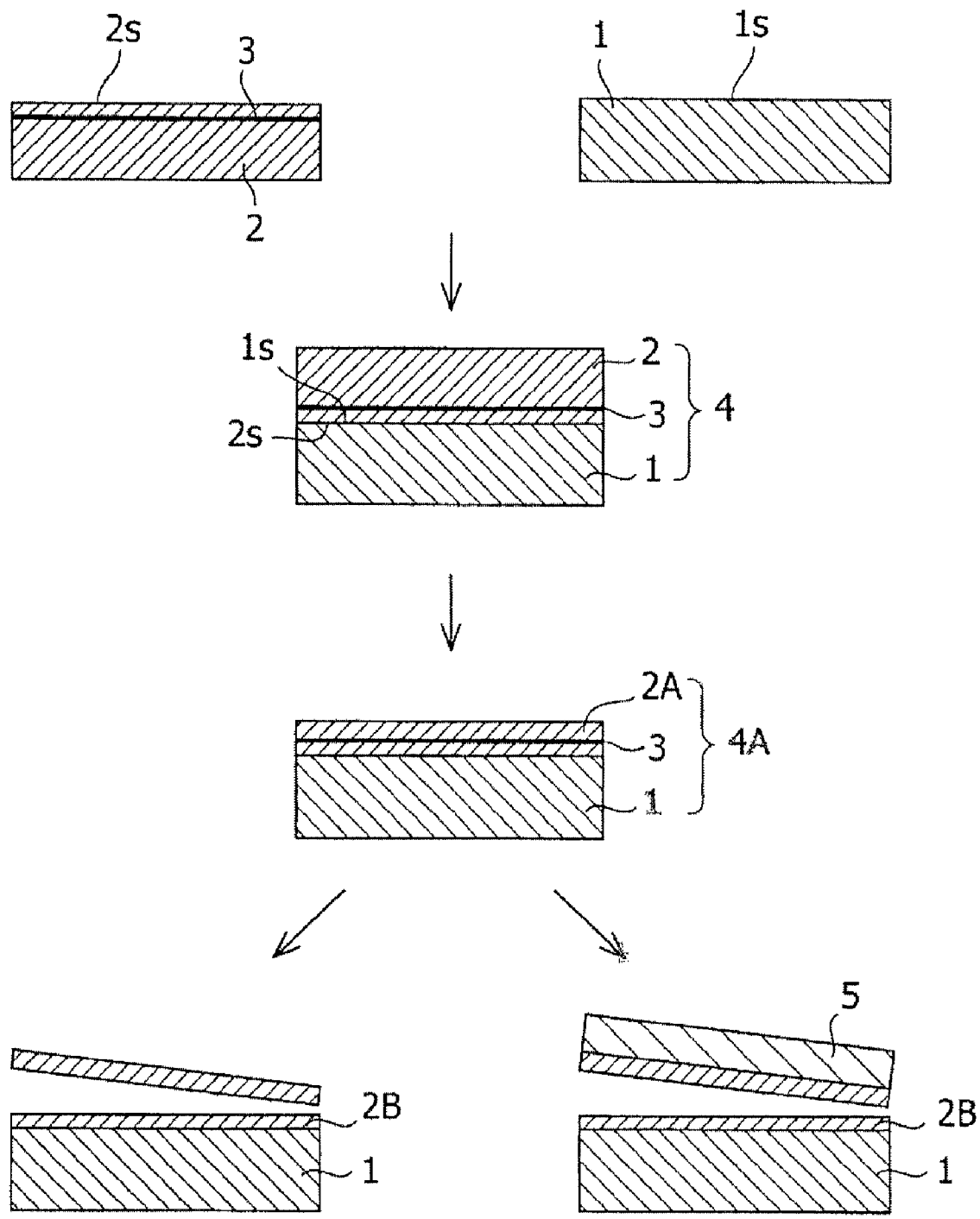

METHOD FOR PRODUCING SILICON FILM-TRANSFERRED INSULATOR WAFER

CROSS REFERENCE TO RELATED APPLICATIONS

The present application is a national phase entry under 35 U.S.C. §371 of International Application No. PCT/JP2009/068593, filed Oct. 29, 2009, published in Japanese, which claims the benefit of Japanese Patent Application No. 2008-281105, filed Oct. 31, 2008, and Japanese Patent Application No. 2009-246252, filed Oct. 27, 2009. The entire disclosures of each of the above-identified applications are incorporated by reference herein.

TECHNICAL FIELD

The present invention relates to a method for producing a silicon-on-insulator (SOI) wafer.

BACKGROUND ART

Conventionally, silicon-on-quartz (SOQ), silicon-on-glass (SOG) and silicon-on-sapphire (SOS) wafers that are collectively referred to as SOI wafers have been devised. Applications of these wafers to projectors, high-frequency devices and so forth have been expected because of the insulation and transparency of handle wafers (quartz, glass, sapphire). Such an SOI wafer is produced by bonding a handle wafer to a silicon wafer (donor wafer).

The conventional SOI fabrication technique includes two main types of bonding processes.

One is called the SOITEC process. In this process, a silicon wafer (donor wafer) into which hydrogen ions have been implanted at room temperature in advance is bonded to a wafer (handle wafer) which serves as a support wafer. Then, the wafers thus bonded are heated at a high temperature (around 500° C.) to generate a large number of fine bubbles, called microcavities, in the ion-implanted interface, and to separate the silicon wafer. Consequently, a silicon film is transferred to the handle wafer.

The other is called the SiGen process. In this process, both a surface of a handle wafer and a surface of a donor wafer into which hydrogen ions have been implanted in advance in the same manner as in the above process, are subject to a plasma treatment so as activate the surfaces. Then, the wafers are bonded to each other, and thereafter the donor wafer is mechanically separated at the hydrogen ion-implanted interface.

The SOITEC process, however, has a drawback because the high-temperature heat treatment is performed after the bonding. Specifically, when the silicon wafer is bonded to the handle wafer that is typified by quartz or sapphire, the heat treatment induces wafer cracking attributable to a large difference in thermal expansion coefficients between the wafers.

Meanwhile, in the SiGen process, although the surface activation treatment allows the donor and handle wafers to have higher bonding strength upon being bonded in comparison with the SOITEC process, the bonded wafers need to be heated at 250° C. or higher. As a result of the heat treatment, the SiGen process has problems of: wafer damaged due to a difference in thermal expansion rate between the bonded wafers; and introduction of an untransferred portion in the transferred silicon film. These problems are attributed to the fact that the temperature rise increases the bonding strength at the bonding interface, but simultaneously causes warpage, detachment, and the like of the bonded wafers because these bonded wafers are different kinds. This prevents bonding of the surfaces of the wafers from progressing uniformly on the surfaces.

Heretofore, the SOS bonding technique has been studied, and a film-formation method has been proposed in which room temperature bonding, low-temperature heat treatment, grinding, and high-temperature heat treatment (900° C. or higher) are performed in this order to complete the bonding (Non-Patent Document 1). Even by this method, however, it is turned out that multiple misfit dislocations and cracks are included in the obtained silicon film layer. A presumable reason for these problems is that the silicon and sapphire substrates are bonded with such a weak bonding that stress generated during the temperature rise and fall causes the bonded surfaces to be displaced from each other. Moreover, since the silicon film is formed by grinding and polishing the silicon substrate, uniformity of the thickness of this film is considerably poor.

Furthermore, the method by Non-Patent Document 1 cannot comprise the steps of implanting hydrogen ions into a donor wafer in advance and using a thus-formed implanted interface as a transfer interface. The reason is that, in the method by Non-Patent Document 1, "the temperature (900° C. or higher) at which the bonding is completed" is much higher than "the temperature (400° C. to 600° C.) at which fine microcavities formed by the hydrogen ion implantation are enlarged for detachment" (Non-Patent Document 2).

A method typical of SOI production, called the SOITEC process (Non-Patent Document 2) comprises steps of: increasing the temperature of bonded wafers up to around 500° C., transferring a film to a handle wafer from a donor wafer into which hydrogen ions have been implanted in advance, and then increasing the temperature further up to 900° C. or higher to complete the bonding. This method has no bonding problem since the material of the handle wafer (silicon) is the same as that of donor wafer (silicon) (i.e., made of the same material).

PRIOR ART DOCUMENT

Non-Patent Document

[Non-Patent Document 1] Abe et al. Jpn. J. Appl. Phys. 33 (1994) p. 514
[Non-Patent Document 2] Bruel et al. Jpn. J. Appl. Phys. 36 (1997) p. 1636

SUMMARY OF THE INVENTION

Problem to be Solved by the Invention

In the bonding of different kinds of substrates targeted by the invention, even if a film is successfully transferred onto a handle wafer at the temperature (400° C. to 600° C.) at which fine microcavities generated by hydrogen ion implantation are enlarged for splitting, the materials having different coefficients of thermal expansion (for example, silicon and sapphire) are subsequently heated (>900° C.). For this reason, shear stress is generated between the materials which are incompletely bonded to each other so that slippage and crystal defects are induced. Thus, in the bonding of different kinds of substrates, it is considered to be essential to prevent the bonded surfaces of the substrates from being displaced from each other during and after heat treatment by means of obtaining a bonding strength to some extent at the time of the bonding.

An object of the present invention is to provide a method for producing an SOI wafer in which an SOI layer is formed on or above an insulating substrate. The method can prevent occurrence of thermal strain, detachment, crack, and the like attributed to a difference in thermal expansion coefficients between the insulating substrate and the SOI layer by using a simple process, and also improve the uniformity of film thickness of the SOI layer.

Means for Solving the Problem

According to the present invention, provided is a method for producing a silicon film-transferred insulator wafer, comprising steps of: performing a surface activation treatment on at least one of a surface of an insulator wafer and a hydrogen ion-implanted surface of a single crystal silicon wafer into which a hydrogen ion has been implanted to form a hydrogen ion-implanted layer in advance; bonding the hydrogen ion-implanted surface to the surface of the insulator wafer to obtain bonded wafers; heating the bonded wafers at a first temperature; grinding and/or etching a surface of a single crystal silicon wafer side of the bonded wafers thus heated so as to thin the single crystal silicon wafer of the bonded wafers; heating the bonded wafers thus ground and/or etched at a second temperature which is higher than the first temperature; and performing detachment at the hydrogen ion-implanted layer by applying a mechanical impact to the hydrogen ion-implanted layer of the bonded wafers thus heated at the second temperature.

Effect of the Invention

The method for producing a silicon film-transferred insulator wafer of the present invention allows production of the insulator wafer on which a silicon film having favorable uniformity of thickness is transferred without thermal strain, detachment, crack and the like attributed to a difference in thermal expansion coefficients between an insulating substrate and a single crystal silicon wafer.

BRIEF DESCRIPTION OF THE DRAWING

FIG. 1 is a drawing for illustrating one example of a production method of the present invention.

EMBODIMENTS FOR CARRYING OUT THE INVENTION

An insulator wafer (handle wafer) may preferably have a dielectric strength of $1 \times 10^7$ V/m or more on the assumption that the wafer is used in a high load environment such as in a power device to which a high electric field is applied. The dielectric strength is measured according to Japanese Industrial Standards (JIS) R2141.

Moreover, from the viewpoint of low dielectric loss, the insulator wafer may preferably have a specific volume resistance of $1 \times 10^8$ Ωcm or higher at room temperature (approximately 20° C.). The specific volume resistance is measured according to JIS R2141.

The insulator wafer may include, but is not particularly limited to, a sapphire wafer, an alumina wafer, an aluminium nitride wafer, a quartz wafer, and a glass wafer such as a borosilicate glass wafer and a crystal glass wafer. The insulator wafer may preferably be selected from the group consisting of a sapphire wafer, an alumina wafer and an aluminium nitride wafer, and may be particularly preferably a sapphire wafer.

The preferable thickness of the insulator wafer may be, but is not particularly limited, desirably as large as the thickness of a silicon wafer specified by Semiconductor Equipment and Materials International (SEMI) or the like. This is because semiconductor devices are often designed to use a wafer having this thickness. From this viewpoint, the thickness may be preferably 300 μm to 900 μm.

The present invention may be particularly effective in a case where the insulator wafer differs from a single crystal silicon wafer in an expansion coefficient (at room temperature: approximately 20° C.) by $2 \times 10^{-6}$/K (absolute value) or larger. The expansion coefficient is measured according to JIS 1618. For example, an SOS has a thermal conductivity approximately 30 times higher than that of quartz so that it is expected to be used for a device which generates heat. However, the SOS has the largest difference from silicon in the thermal expansion coefficient, and is therefore most likely to cause a problem such as wafer cracking in a heat treatment after bonding. The present invention may be particularly effective as a method for producing the SOS which is likely to be damaged by a difference in thermal expansion coefficients when the SOS is exposed to a high temperature even after the bonding strength is increased by a slow and careful low-temperature treatment.

A single crystal silicon wafer (donor wafer) may include, but is not particularly limited to, a wafer obtained by slicing a single crystal grown by the Czochralski process, the wafer having, for example, a diameter of 100 mm to 300 mm, a conductivity type of P type or N type, and a resistivity of approximately 10 Ω·cm.

The single crystal silicon wafer may preferably have a thin insulating film formed in advance on a surface of the single crystal silicon wafer. This is because implantation of hydrogen ions through the insulating film can suppress the channeling of the implanted ions. The insulating film may be preferably a silicon oxide film having a thickness of 50 nm to 500 nm. When the thickness is too small thickness, it may be difficult to control the film thickness of the oxide film. When the thickness is too large thickness, it may take a longer time for the oxide film to be formed. The silicon oxide film can be formed by a generally-used thermal oxidation method.

The single crystal silicon wafer has an ion-implanted layer inside of the single crystalline silicon wafer which the layer has been formed by implanting hydrogen ions from the surface of the wafer. As for the implantation, for example, the temperature of the single crystal silicon wafer may be set to be in the range of 250° C. to 450° C. and at least one of a hydrogen ion and a rare gas ion may be implanted at a predetermined dosage and at such an implantation energy that the ion-implanted layer can be formed at a desired depth from the surface of the single crystal silicon wafer. As conditions at this event, for example, the implantation energy can be set to be from 50 keV to 100 keV, and the implantation dosage can be set to be from $2 \times 10^{16}$/cm$^2$ to $1 \times 10^{17}$/cm$^2$.

The hydrogen ion to be implanted may be preferably a hydrogen ion (H$^+$) at a dose of $2 \times 10^{16}$ to $1 \times 10^{17}$ (atoms/cm$^2$) or a hydrogen molecular ion (H$_2^+$) at a dose of $1 \times 10^{16}$ to $5 \times 10^{16}$ (atoms/cm$^2$). It may be particularly preferably a hydrogen ion (H$^+$) at a dose of $8.0 \times 10^{16}$ (atoms/cm$^2$) or a hydrogen molecular ion (H$_2^+$) at a dose of $4.0 \times 10^{16}$ (atoms/cm$^2$). The ion-implanted layer formed at these doses can have vulnerability suitable for later mechanical detachment.

The depth from the surface of the ion-implanted wafer to the ion-implanted layer may be variable, depending on a desired thickness of a silicon film provided on or above the insulator wafer. The depth from the surface of the ion-implanted wafer to the ion-implanted layer may be preferably 300 nm to 500 nm, further preferably around 400 nm. The ion-implanted layer may preferably have such a thickness as to be readily detached with a mechanical impact. The thickness may be preferably 200 nm to 400 nm, further preferably around 300 nm.

Hereinafter, the production method of the present invention will be described on the basis of an example illustrated in FIG. 1. However, it should not be construed that the present invention is limited to this.

A surface activation treatment is performed on both or one of a surface 1s of an insulator wafer 1, and a hydrogen ion-implanted surface 2s of a single crystal silicon wafer 2. In the single crystal silicon wafer 2, hydrogen ions have been implanted in advance to form a hydrogen ion-implanted layer 3 therein. The surface activation treatment is a treatment for activating a surface by increasing the number of OH groups on the surface. Examples of this treatment may include an ozone water treatment, a UV ozone treatment, an ion beam treatment, a plasma treatment, and a combination thereof. Although the mechanism of increasing the bonding strength by the surface treatment may not be understood completely, the following explanation may be applicable. In an ozone water treatment and a UV ozone treatment, organic materials on the surface are decomposed by the ozone to increase the number of OH groups on the surface, thereby the surface being activated. On the other hand, in an ion beam treatment and a plasma treatment, non-binding bonds (dangling bonds) are exposed, or OH groups are added to the non-binding bonds brings, thereby the surface being activated. The surface activation can be checked by testing the degree of hydrophilicity (wettability). More specifically, an easy and simple measurement can be done by placing a drop of water on a wafer surface and then measuring a contact angle.

In the ozone water treatment, a wafer can be dipped in ozone water wherein ozone has been dissolved in pure water at a concentration of, for example, about 10 mg/L.

In the UV ozone treatment, for example, irradiation of UV light (such as light having 185 nm of wavelength) to an ozone gas or an ozone gas generated from an air can be employed.

In the ion beam treatment, for example, a wafer surface is treated with an ion beam of an inert gas such as Ar under a high vacuum as in the sputtering method so that non-binding bonds can be exposed on the surface for increasing the bonding strength.

In the plasma treatment, for example, a semiconductor substrate and/or a handle substrate is placed in a chamber into which a plasma gas is introduced at a reduced pressure, and exposed to, for example, approximately 100 W of high-frequency plasma for approximately 5 seconds to 10 seconds. Thus, the surface is plasma-treated. When the semiconductor substrate is treated, examples of the plasma gas may include oxygen plasma gas plasma in a case of oxidizing the surface; and a hydrogen gas, an argon gas, a gas mixture of hydrogen and argon, and a gas mixture of hydrogen and helium in a case of not oxidizing the surface. When the handle substrate is treated, any of these gases may be used. In the treatment, the organic materials on the surface of the semiconductor substrate and/or the handle substrate are oxidized and removed so that the number of OH groups on the surface increases for surface activation.

In the above four treatments, both of the ion-planted surface of the semiconductor and a surface of the handle substrate to be bonded may be preferably treated although one of the surfaces may be treated.

The surface activation treatment may be preferably performed so as to obtain a surface roughness of 0.5 nm or less in RMS (root mean square roughness) in accordance with JIS (Japan Industrial Standards) B0601, using an atomic force microscope (AFM). Such a surface roughness can allow the bonding to progress smoothly without any problem. Moreover, the preferable lower limit may be approximately 0.1 nm to 0.2 nm because it may be difficult to obtain a surface roughness below this limit.

Next, the hydrogen ion-implanted surface 2s and the insulator wafer surface 1s are bonded to each other to obtain bonded wafers 4. By the bonding, a certain bonding strength can be ensured at this point, for example. As described above, the activation treatment is performed on at least one of the ion-implanted surface of the single crystal silicon wafer and the surface of the insulating substrate. This treatment allows these surfaces to be bonded strongly with a strength high enough to withstand a force by mechanical detachment at a later step, only by bringing them into close contact with each other under conditions of, for example, a reduced pressure or normal pressure, and preferably at a normal temperature around room temperature (approximately 20° C.) without cooling nor heating. Thus, this treatment is preferable because it does not require a heat treatment for bonding at a high temperature, and can eliminate risk of problematic thermal strain, crack, detachment at the bonded surfaces, and the like due to the difference in thermal expansion coefficients, which would otherwise occur by heating.

The bonded wafers 4 are heated at a first temperature for provisional bonding. The first temperature may be preferably 175° C. or higher but lower than 225° C., and more preferably 200° C. or higher but lower than 225° C. Experience shows that, if a heat treatment at 225° C. or higher is performed on the bonded wafers, problems such as wafer cracking may occur frequently. For example, suppose a case where the insulating substrate is sapphire having a thermal expansion coefficient higher than that of silicon (Si: $2.6 \times 10^{-6}$/K, sapphire: $5.8 \times 10^{-6}$/K). In this case, when bonded wafers formed by bonding the sapphire insulating substrate to a single crystal silicon wafer having substantially the same thickness as that of the sapphire insulating substrate is heated at a temperature exceeding 225° C., thermal strain may occur, leading to wafer cracking. On the other hand, the heat treatment at a temperature lower than 225° C. may be preferable since there may be no risk of thermal strain, crack, detachment, and the like due to the difference in thermal expansion coefficients. The first temperature may be set to 175° C. or higher because the strength of the provisional bonding may be hardly increased by a heat treatment at a temperature lower than 175° C. even after an extended period of the treatment.

When a batch heat treatment furnace is used in this heat treatment step, approximately 0.5 hours to 24 hours of heat treatment, for example, may be enough to obtain sufficient effects.

The surface of the single crystal silicon wafer side of the bonded wafers 4 thus heated is ground to form a bonded wafers 4A having a thin single crystal silicon wafer 2A. Instead of grinding, etching can be performed thereon with an alkaline solution or the like. Alternatively, the combination of the two processes can be employed. By the grinding and/or the etching, the thickness of the single crystal silicon wafer may become preferably 250 µm or smaller, more preferably 150 µm to 200 µm.

The thickness of the single crystal silicon wafer before the grinding and/or the etching may preferably exceed 250 µm, more preferably 300 µm to 900 µm, and further preferably 400 µm to 800 µm. Incidentally, the thickness of a typical single crystal silicon wafer is approximately 625 µm when its diameter is 150 mm, while it is approximately 725 µm when its diameter is 200 mm.

The bonded wafers obtained by thinning the bonded wafers on the side of the single crystal silicon wafer can readily curve at the side of the single crystal silicon wafer so that its resistance to cracking due to warpage can be increased. If the single crystal silicon wafer is excessively thinned, a problem may occur in terms of strength. Thus, the thickness of the single crystal silicon wafer may preferably exceed 150 μm. However, when a protection tape or a protection chuck to be described later is used, the thickness of the single crystal silicon wafer may be preferably 10 μm or larger, and more preferably 50 μm or larger. Note that the thickness of the hydrogen ion-implanted layer 3 is excluded from the thickness of the single crystal silicon wafer. It is because the hydrogen ion-implanted layer 3 is very thin so that the thickness of the hydrogen ion-implanted layer 3 may be ignored.

A commercially-available grinder such as a BG (back grind) unit manufactured by TOKYO SEIMITSU CO., LTD., for example, can be used for the grinding.

For the etching, an etchant may preferably include a base selected from the group consisting of potassium hydroxide, sodium hydroxide, cesium hydroxide, ammonia and ammonium hydroxide. It is possible to use an etching solution containing an organic solvent selected from the group consisting of EDP (ethylenediamine-pyrocatechol-water), TMAH (tetramethylammonium hydroxide) and hydrazine. In both cases, the etching rate may be, but not limited to, desirably 100 nm/min or higher so as to thin the silicon wafer having a thickness of several hundred micrometers.

The bonded wafers 4A thus ground and/or etched are heated at a second temperature, which is higher than the first temperature, to obtain a sufficient bonding strength. The second temperature may be preferably 225° C. to 400° C. Because the single crystal silicon wafer has been thinned into a film by the grinding and/or the etching, this heat treatment may be performed at a higher temperature to some extent. This temperature range may be preferable for the second temperature because the sufficient bonding strength can be obtained in this temperature range, while the high bonding strength cannot be obtained unless the second temperature is higher than the first temperature.

The second temperature may be more preferably 250° C. to 350° C., which is higher than the first temperature, from the viewpoints of obtaining a strong bonding strength and of not applying an unnecessary stress to the bonded wafers, although the silicon substrate has been thinned into the film. The thermal expansion rate of silicon is $2.6 \times 10^{-6}$/K, whereas those of quartz and sapphire are $0.56 \times 10^{-6}$/K and $5.8 \times 10^{-6}$/K, respectively. The difference in thermal expansion coefficients $\Delta\alpha = \alpha(\text{donor}) - \alpha(\text{handle}))$ is $\Delta\alpha = 2.04 \times 10^{-6}$/K in a case of SOQ, and is $\Delta\alpha = -3.2 \times 10^{-6}$/K in a case of SOS. Moreover, the expansion coefficient of an aluminium nitride (AlN), which is material for another typical insulating substrate, is approximately $4.8 \times 10^{-6}$/K ($\Delta\alpha = -2.2 \times 10^{-6}$/K). Thus, a silicon-on-AlN is considered to be in a similar situation as in that of the SOS. Among these, the SOS is the most difficult to be fabricated because of the largest absolute value of $\Delta\alpha$. It is surprising that the simple two-staged heat treatment in accordance with the thickness results in, even in the SOS having the largest absolute value of $\Delta\alpha$, suppression of thermal strain and prevention of detachment, crack and the like.

After the grinding and/or etching and before the heat treatment at the second temperature, the ground and/or etched surface of the single crystal silicon wafer may be preferably minor-finished by being polished into a mirror surface due to the following reason. In the heat treatment at the second temperature, the temperature can be increased because the substrate has been thinned so that a thermal stress in a thickness direction of the substrate can be relaxed. However, grinding traces may be left after the grinding, and such fine cracks may trigger substrate damaging due to the thermal stress or substrate damaging during the subsequent mechanical detachment. For this reason, the mirror finish may be performed after the grinding. Consequently, the number of cracks on the surface may be reduced and the substrate damaging risk can be significantly reduced. This step can be mainly and particularly effective when employed for the SOS having a large difference in thermal expansion coefficients.

This polishing can be performed using a polisher. By this polishing, polishing called "touch polish" can be performed with an extremely small polish margin of 5 nm to 400 nm, for example. The BG unit (back grinder, back surface grinder) manufactured by TOKYO SEIMITSU CO., LTD., or the like can be used as the polisher. It is determined that a mirror surface is obtained when no grinding streak is observed visually under a fluorescent light.

A mechanical impact is applied to the hydrogen ion-implanted layer 3 of the bonded wafers 4A thus heated at the second temperature. Consequently, detachment is induced at the hydrogen ion-implanted layer 3, and a silicon film 2B is transferred to the handle wafer.

Since the mechanical detachment is induced by applying the impact to the ion-implanted layer, there is no risk of thermal strain, crack, detachment at the bonded surfaces, and the like due to heating. The detachment may preferably involve cleavage from one end portion toward the other end portion.

In order to apply the impact to the ion-implanted layer, for example, a jet of a fluid such as gas and liquid may be blown continuously or intermittently to a side surface of the bonded wafers, or a detacher may be used. However, the way of impact application is not particularly limited thereto, as long as the mechanical detachment is induced by the impact. The detacher can render the mechanical impact to the bonded wafers treated at the second temperature from the side of the ion-implanted layer. The part of the detacher which contacts the side of the ion-planted layer may be preferably sharpened and movable along the ion-planted layer. The detacher may be preferably a tool having an acute angle such as a wedge, or equipment comprising a blade with an acute angle. They may be made of plastic such as polyether ether ketone, zirconia, silicon, diamond or like, and the metal can be also used when contamination is not an issue. The tool having an acute angle such as a wedge may include a wedge and a blade of scissors.

A reinforcing member may be preferably placed on the single crystal silicon wafer side of the bonded wafers, when the mechanical impact is applied. The reinforcing member may be preferably selected from the group consisting of a protection tape, an electrostatic chuck and a vacuum chuck. Further reliable separation can be obtained by performing the detachment after placing a protection tape 5 for crack prevention on the single crystal silicon wafer side of the bonded wafers; or the detachment after bringing the electrostatic chuck or the vacuum chuck into close contact with the single crystal silicon wafer side of the bonded wafers.

The material, thickness and the like of the protection tape may not be limited. The protection tape may include a dicing tape and a BG tape, which are used in a semiconductor fabrication process. The electrostatic chuck may include, but is not limited to, a ceramic electrostatic chuck such as one made of silicon carbide or aluminium nitride. The vacuum chuck may include, but is not limited to, a vacuum chuck such as one made of porous polyethylene or alumina.

The silicon film-transferred SOI wafer thus produced comprises a silicon layer formed on a transparent insulating substrate and has high carrier mobility. The silicon film-transferred SOI wafer can be fabricated without thermal strain, detachment, crack, and the like, and be useful in various device fabrications because the silicon film is thin, uniform in the thickness and excellent in the crystallinity.

When the insulator wafer is transparent, the SOI wafer comprises the silicon layer on or above the transparent insulator wafer so that the SOI wafer may be particularly suitable for production of substrates for electro-optical devices such as liquid crystal devices.

EXAMPLES

Hereinbelow, the present invention will be described on the basis of Experiments and Comparative Experiment. However, it should not be construed that the present invention is limited to them below.

Experiments 1 to 6 and Comparative Experiment 1

A surface activation treatment was performed on both surfaces of a single crystal silicon wafer (thickness: 625 µm, diameter: 150 mm) in which an oxide film had grown to 200 nm in advance; and a sapphire wafer manufactured by KYOCERA Corporation. Specifically, nitrogen was applied as a plasma gas to the surfaces, which were then treated with high-frequency plasma for 30 seconds. The activated surfaces were subsequently bonded to each other. Hydrogen ions had implanted from the surface of the single crystal silicon wafer having the thermal oxide film under conditions of an implantation energy of 50 keV and an implantation dosage of $8\times10^{16}/cm^2$, so that the single crystal silicon wafer had a hydrogen ion-implanted layer at a depth of 325 nm from the surface, the hydrogen ion-implanted layer having a thickness of 200 nm.

The bonded wafers were heated at 200° C. for 48 hours. In Comparative Experiment 1, the surface of the single crystal silicon wafer side of the bonded wafers was not ground. In Examples, the surface of the single crystal silicon wafer side of the bonded wafers was then ground by using a BG unit manufactured by TOKYO SEIMITSU CO., LTD., so as to have a predetermined silicon thickness. The silicon thickness was 50 µm in Experiment 1, 100 µm in Experiment 2, 150 µm in Experiment 3, 200 µm in Experiment 4, 250 µm in Experiment 5, and 300 µm in Experiment 6.

The bonded wafers were then heated at 300° C. for 6 hours. The bonded wafers having the silicon wafer unground in Comparative Example 1 and the bonded wafers having the silicon wafer ground to have a silicon thickness of 300 µm in Example 6 were damaged on the side of the single crystal silicon wafer during the heat treatment.

As a mechanical impact applied to the ground wafers, a blade of paper scissors was hammered in a wedge-like fashion several times into a side face of the bonded wafers at diagonal positions of the bonded wafers, and thereby the single crystal silicon wafer of the bonded wafers was detached at the ion-implanted interface. At this event, the detachment was performed in two ways: one was with a protection vacuum chuck made of porous polyethylene and having the same diameter as the wafer and a thickness of approximately 5 mm, the protection vacuum chuck being adsorbed to the single crystal silicon wafer; and the other was without the protection vacuum chuck. The results are shown in Table 1.

TABLE 1

| | thickness of silicon wafer after ground (µm) | after heat teatment At 300° C. | step of detachment | |
|---|---|---|---|---|
| | | | vaccum chuck being present | vaccum chuck being absent |
| Experiment 1 | 50 | not damaged | not damaged | damaged |
| Experiment 2 | 100 | not damaged | not damaged | damaged |
| Experiment 3 | 150 | not damaged | not damaged | damaged |
| Experiment 4 | 200 | not damaged | not damaged | not damaged |
| Experiment 5 | 250 | not damaged | not damaged | not damaged |
| Experiment 6 | 300 | damaged | — | — |
| Comp. Ex. 1 | not ground | damaged | — | — |

The bonded wafers having a silicon thickness of larger than 250 µm after the grinding were damaged during the heat treatment at 300° C. (Comparative Experiment 1 and Experiment 6). The bonded wafers having a silicon thickness of 200 µm or 250 µm after the grinding provided the SOS wafer having the silicon film transferred, regardless of the use of the protection chuck (Experiments 1 and 2). The bonded wafers having a silicon thickness of 150 µm or smaller after the grinding were damaged during the detachment without use of the protection chuck, but were successfully detached in use of the protection chuck so that an SOS wafer having the silicon film transferred was obtained (Experiments 3 to 5).

| EXPLANATION OF REFERENCE NUMERALS | |
|---|---|
| 1 | insulator wafer |
| 1s | insulator wafer surface |
| 2 | single crystal silicon wafer |
| 2s | single crystal silicon wafer surface |
| 2A | single crystal silicon wafer |
| 2B | silicon film |
| 3 | hydrogen ion-implanted layer |
| 4 | bonded wafers |
| 4A | bonded wafers |
| 5 | protection tape |

The invention claimed is:

1. A method for producing a silicon film-transferred insulator wafer, the method comprising:
   a surface activation step of performing a surface activation treatment on at least one of a surface of an insulator wafer and a hydrogen ion-implanted surface of a single crystal silicon wafer into which a hydrogen ion has been implanted to form a hydrogen ion-implanted layer;
   a bonding step of bonding the hydrogen ion-implanted surface to the surface of the insulator wafer to obtain bonded wafers;
   a first heating step of heating the bonded wafers at a first temperature;
   a grinding and/or etching step of grinding and/or etching a surface of a single crystal silicon wafer side of the bonded wafers thus heated so as to thin the single crystal silicon wafer of the bonded wafers;
   a second heating step of heating the bonded wafers thus ground and/or etched at a second temperature which is higher than the first temperature; and a detachment step of performing detachment at the hydrogen ion-implanted layer by applying a mechanical impact to the hydrogen ion-implanted layer of the bonded wafers thus heated at the second temperature, wherein after said grinding and/or etching step and before said second heating step, a mirror finish step of polishing the ground and/or etched surface of the single crystal silicon wafer side of the bonded wafers into a mirror surface.

2. The method for producing a silicon film-transferred insulator wafer according to claim 1, wherein the mechanical impact is applied by a detacher to a side of the hydrogen ion-implanted layer of the bonded wafers heated at the second temperature.

3. The method for producing a silicon film-transferred insulator wafer according to claim 1, wherein said detachment step comprises applying the mechanical impact, while placing a reinforcing member on the single crystal silicon wafer side of the bonded wafers.

4. The method for producing a silicon film-transferred insulator wafer according to claim 3, wherein said reinforcing member is selected from the group consisting of a protection tape, an electrostatic chuck and a vacuum chuck.

5. The method for producing a silicon film-transferred insulator wafer according to claim 1, wherein said insulator wafer is selected from the group consisting of a sapphire wafer, an alumina wafer, an aluminum nitride wafer, a quartz wafer and a glass wafer.

6. The method for producing a silicon film-transferred insulator wafer according to claim 1, wherein said hydrogen ion-implanted surface of the single crystal silicon wafer has been covered with a silicon oxide film.

7. The method for producing a silicon film-transferred insulator wafer according to claim 1, wherein said first temperature is 175° C. or higher but lower than 225° C., and said second temperature is from 225° C. to 400° C.

8. The method for producing a silicon film-transferred insulator wafer according to claim 1, wherein said the grinding and/or etching step comprises grinding and/or etching the surface of the single crystal silicon wafer side of the bonded wafers to thin the single crystal silicon wafer to a thickness of 250 μm or smaller.

9. The method for producing a silicon film-transferred insulator wafer according to claim 1, wherein said surface activation treatment is one or more elected from the group consisting of an ozone water treatment, a UV ozone treatment, an ion beam treatment and a plasma treatment.

10. The method for producing a silicon film-transferred insulator wafer according to claim 1, wherein said grinding and/or etching step is an etching step comprising use of an etching solution containing a base selected from the group consisting of potassium hydroxide, sodium hydroxide, cesium hydroxide, ammonia and ammonium hydroxide.

11. The method for producing a silicon film-transferred insulator wafer according to claim 1, wherein said grinding and/or etching step is an etching step comprising use of an etching solution containing an organic solvent selected from the group consisting of EDP (ethylenediamine-pyrocatechol-water), TMAH (tetramethylammonium hydroxide) and hydrazine.

12. The method for producing a silicon film-transferred insulator wafer according to claim 1, wherein the hydrogen ion implanted into the single crystal silicon wafer is a hydrogen ion (W) at a dose of $2\times10^{16}$ to $1\times10^{17}$ (atoms/cm$^2$), or a hydrogen molecular ion (H$_2^+$) at a dose of $1\times10^{16}$ to $5\times10^{16}$ (atoms/cm$^2$).

13. The method for producing a silicon film-transferred insulator wafer according to claim 1, wherein said surface activation treatment is a plasma treatment to obtain a surface roughness of 0.5 nm or less in RMS.

14. The method for producing a silicon film-transferred insulator wafer according to claim 1, wherein said insulator wafer has a dielectric strength of at least $1\times10^7$ V/m.

15. The method for producing a silicon film-transferred insulator wafer according to claim 1, wherein said insulator wafer has a specific volume resistance of at least $1\times10^8$ Ωcm at room temperature.

16. The method for producing a silicon film-transferred insulator wafer according to claim 1, wherein a difference in expansion coefficients at room temperature between said insulator wafer and said single crystal silicon wafer is at least $2\times10^{-6}$/K (absolute value).

* * * * *

UNITED STATES PATENT AND TRADEMARK OFFICE
CERTIFICATE OF CORRECTION

PATENT NO. : 8,138,064 B2
APPLICATION NO. : 12/922569
DATED : March 20, 2012
INVENTOR(S) : Shoji Akiyama et al.

It is certified that error appears in the above-identified patent and that said Letters Patent is hereby corrected as shown below:

In the Specifications:

Column 1, line 45, "process, are" should read --process are--
Column 1, line 46, "as activate" should read --as to activate--
Column 2, line 30, "2) comprises" should read --2), comprises--
Column 4, line 37, "is too" should read --is a too--
Column 4, line 39, "is too" should read --is a too--
Column 6, line 54, "wafers" should read --wafer--
Column 9, line 20, "them" should read --those mentioned--

In the Claims:

Column 11, line 38, "said the grinding" should read --said grinding--
Column 12, line 3, "elected" should read --selected--
Column 12, line 22, "(W)" should read --($H^+$)--

Signed and Sealed this
Fourth Day of June, 2013

Teresa Stanek Rea
*Acting Director of the United States Patent and Trademark Office*